US006680213B2

(12) United States Patent
Farnworth et al.

(10) Patent No.: US 6,680,213 B2
(45) Date of Patent: Jan. 20, 2004

(54) METHOD AND SYSTEM FOR FABRICATING CONTACTS ON SEMICONDUCTOR COMPONENTS

(75) Inventors: Warren M. Farnworth, Nampa, ID (US); Alan G. Wood, Boise, ID (US); Douglas Kelly, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/824,125

(22) Filed: Apr. 2, 2001

(65) Prior Publication Data

US 2002/0142494 A1 Oct. 3, 2002

(51) Int. Cl.[7] ........................... G01R 31/26; H01L 21/66

(52) U.S. Cl. ........................................... 438/15; 438/14

(58) Field of Search .......................... 438/5, 10, 11, 438/14, 17, 18, 15; 228/102, 103, 104.4, 179.1, 180.1, 180.21, 180.22

(56) References Cited

U.S. PATENT DOCUMENTS

| | | | |
|---|---|---|---|
| 5,007,576 A | * | 4/1991 | Congleton et al. |
| 5,255,051 A | | 10/1993 | Allen |
| 5,327,338 A | | 7/1994 | Allen et al. |
| 5,346,861 A | * | 9/1994 | Khandros et al. |

(List continued on next page.)

FOREIGN PATENT DOCUMENTS

JP      402134840 A      5/1990

OTHER PUBLICATIONS

Ali R. Ehsani & Matt Kesler, "Lasers Speed up Board Production", May 2000, IEEE Spectrum, pp. 40–45.

DuPont Printed Circuit Materials, Riston LaserSeries, technical brochure, pp. 1–8, H–73185.

DuPont Photopolymer & Electronic Materials, technical data, Riston Aqueous–processable, Photopolymer Films, General Processing Guide, pp. 1–15, DS 97–41, (Dec. 1997).

U.S. patent application Ser. No. 09/933,492, filed Aug. 20, 2001, "Method for Fabricating Semiconductor Components".

An Innovative Solution For Solder Application Solder Ball Bumper (SBB), PacTech, Packaging Technologies, brochure, pp. 1–3.

*Primary Examiner*—Carl Whitehead, Jr.
*Assistant Examiner*—Nema Berezny
(74) *Attorney, Agent, or Firm*—Stephen A. Gratton

(57) ABSTRACT

A method for fabricating contacts on semiconductor components includes the steps of testing the components, and then using test data to fabricate the contacts on only components that meet a predetermined criteria. Initially a substrate, such as a wafer or a panel, containing multiple semiconductor components, such as dice or packages, is provided. The components include integrated circuits, and component contacts in electrical communication with the integrated circuits. In a first embodiment, a ball bumper apparatus programmed with the test data forms contact bumps on dice contained on a semiconductor wafer. In a second embodiment, a ball bumper apparatus programmed with the test data forms contact bumps on packages contained on a panel. In a third embodiment, a stencil mask is patterned with openings using a laser scanner programmed with the test data, and solder is stenciled into the openings, and reflow bonded to the component contacts to form contact bumps. In a fourth embodiment, a polymer film is patterned with openings using a laser scanner programmed with the test data, and a ball alignment fixture is fabricated with the patterned polymer film, and then used to reflow pre-formed solder balls to the component contacts.

33 Claims, 11 Drawing Sheets

U.S. PATENT DOCUMENTS

| | | |
|---|---|---|
| 5,386,221 A | 1/1995 | Allen et al. |
| 5,682,061 A * | 10/1997 | Khandros et al. |
| 5,786,632 A | 7/1998 | Farnworth et al. |
| 5,876,902 A | 3/1999 | Veneklasen et al. |
| 5,895,581 A | 4/1999 | Grunwald |
| 5,990,566 A | 11/1999 | Farnworth et al. |
| 6,037,967 A | 3/2000 | Allen et al. |
| 6,048,753 A | 4/2000 | Farnworth et al. |
| 6,059,176 A | 5/2000 | Azdasht et al. |
| 6,088,379 A | 7/2000 | Owa et al. |
| 6,100,175 A | 8/2000 | Wood et al. |
| 6,110,823 A * | 8/2000 | Eldridge et al. ............ 438/660 |
| 6,115,175 A | 9/2000 | Maruyama et al. |
| 6,119,919 A | 9/2000 | Kasulke |
| 6,262,390 B1 | 7/2001 | Goland et al. |
| 6,335,210 B1 * | 1/2002 | Farooq et al. |
| 6,342,399 B1 * | 1/2002 | Degani |
| 6,415,977 B1 | 7/2002 | Rumsey |
| 6,462,575 B1 | 10/2002 | Cram |
| 6,472,239 B2 | 10/2002 | Hembree et al. |

* cited by examiner

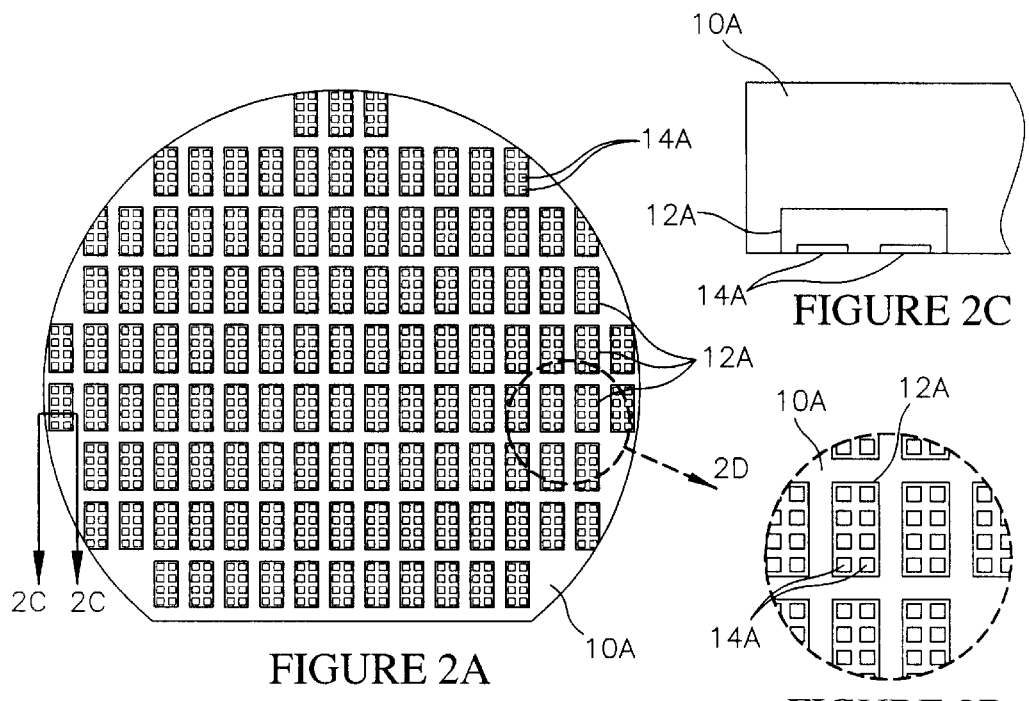
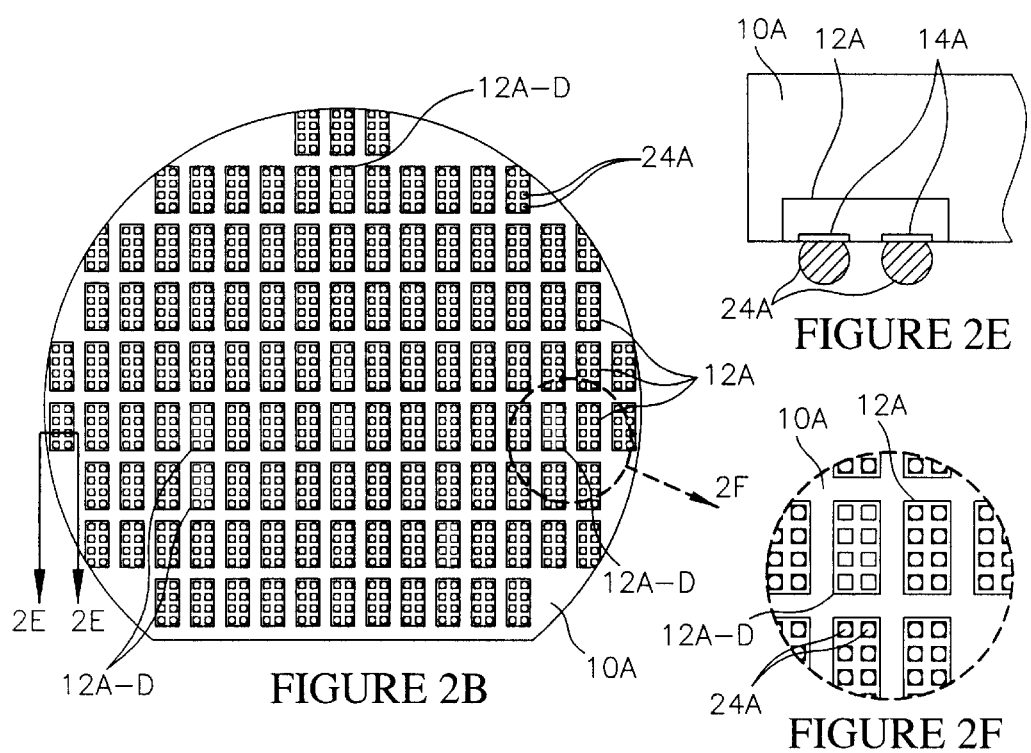

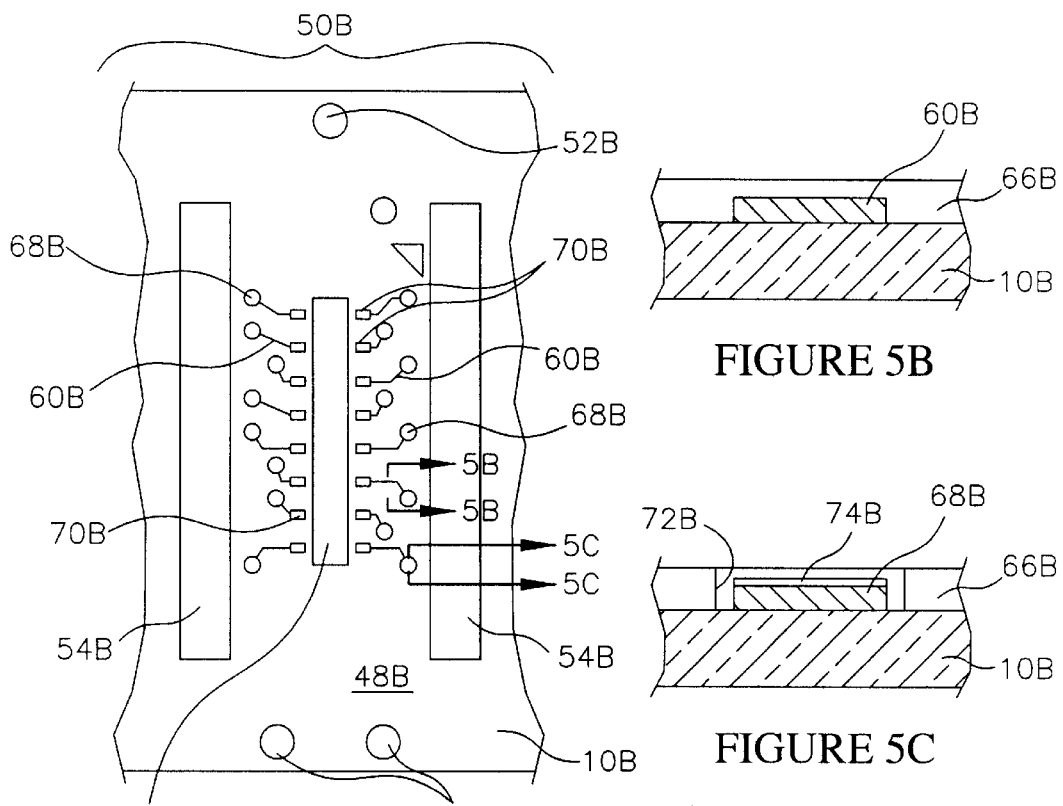
FIGURE 5A
FIGURE 5B
FIGURE 5C
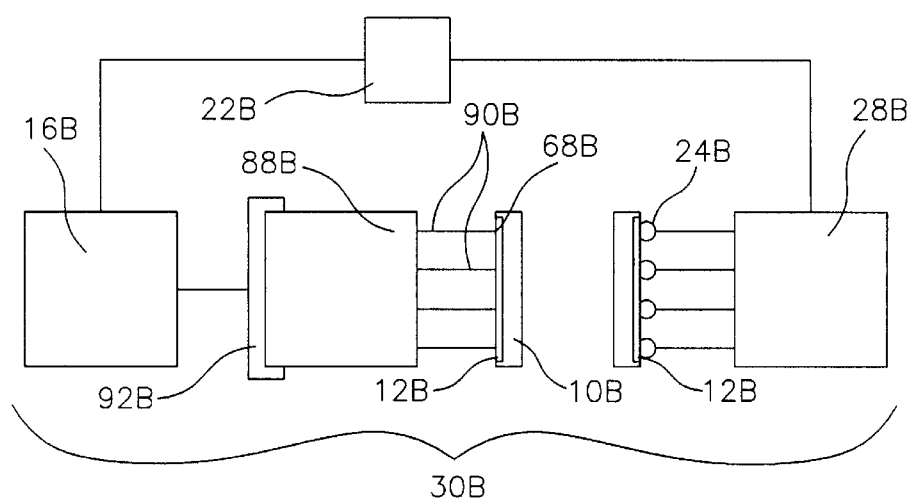
FIGURE 6

METHOD AND SYSTEM FOR FABRICATING CONTACTS ON SEMICONDUCTOR COMPONENTS

FIELD OF THE INVENTION

This invention relates generally to semiconductor manufacture, and more particularly to a wafer level method and system for fabricating contacts on semiconductor components.

BACKGROUND OF THE INVENTION

Semiconductor components such as dice, packages, and interconnects, are typically fabricated on a single substrate (e.g., a wafer or a panel) using wafer level fabrication processes. One step that is often performed at the wafer level is the fabrication of contacts on the components. For example, solder bumps can be fabricated on semiconductor dice using a deposition process, permitting controlled collapse chip connections (C4) to be made for packaging. As another example, solder balls can be fabricated on semiconductor packages by bonding pre-formed balls using solder reflow performed with a furnace or a laser. Often the solder balls are arranged in a ball grid array (BGA), or a fine ball grid array (FBGA), and function as the terminal contacts for the packages.

One aspect of wafer level fabrication processes is that the components on the substrate can have different characteristics making some components "good" and some components "defective" or "substandard". For example, physical defects can occur in some of the components on the substrate making these components non-functional. Other components on the substrate can be functional, yet have substandard electrical characteristics. One important electrical characteristic is the speed with which the components process signals. Some functional components can have speed characteristics that make the components unsuitable for a particular application.

In the past it has been conventional to form contacts on all of the components contained on a substrate, regardless of the characteristics of the components. For example, conventional C4 deposition processes bump all of the dice contained on a wafer. Similarly, conventional solder reflow processes bond solder balls to all of the components on a panel. In both cases, contacts are formed on the defective and substandard components as well on the good components. One shortcoming of these conventional contact fabrication processes is that time and materials are wasted in forming the contacts on the defective and substandard components.

The present invention recognizes that it is advantageous for a contact fabrication process to consider the characteristics of the components prior to forming the contacts on the components. Accordingly, the present invention utilizes testing in combination with contact fabrication to improve wafer level fabrication processes for semiconductor components.

SUMMARY OF THE INVENTION

In accordance with the present invention, a method for fabricating contacts on semiconductor components is provided. Also provided are a system for performing the method, and improved semiconductor components fabricated using the method.

Initially, a substrate containing multiple semiconductor components is provided. The substrate can comprise a semiconductor wafer, or a portion thereof, containing multiple semiconductor dice or semiconductor packages. Alternately, the substrate can comprise a panel made of an organic material, such as a glass filled resin, containing multiple semiconductor packages. Each component includes a pattern of component contacts, such as bond pads, in electrical communication with integrated circuits contained on the component.

As a first step, the components on the substrate are tested to evaluate and characterize the components. The testing step can include "functional" tests for evaluating a gross functionality of the components, as well as "parametric" tests for evaluating various electrical characteristics of the components (e.g., speed). In addition to evaluating the components, the testing step "maps" the substrate by characterizing each component, and identifying its unique location on the substrate.

Test data from the testing step is then used to fabricate contacts on only those components that meet a predetermined criteria. This saves time and materials as contacts are not formed on the components that do not meet the predetermined criteria. Representative predetermined criteria include functionality, speed and reparability.

In a first embodiment of the invention, the components comprise semiconductor dice contained on a wafer, and the contacts comprise contact bumps formed on die bond pads using a ball bumper apparatus. The ball bumper apparatus uses preformed solder balls that are reflow bonded to the bond pads using a laser. In addition, the ball bumper apparatus is programmed with the test data to bump only those dice that meet the predetermined criteria. A system for performing the first embodiment method includes the ball bumper apparatus, and a wafer prober for testing the dice. The wafer prober includes a probe card having probe contacts in electrical communication with test circuitry.

In a second embodiment of the invention, the components comprise semiconductor packages contained on a panel, and the contacts comprise contact bumps formed on bump bonding pads using a ball bumper apparatus. A system for performing the second embodiment method includes the ball bumper apparatus, and a test socket for testing the packages, The test socket includes spring loaded electrical connections (e.g., "POGO PINS") in electrical communication with test circuitry, which are configured to electrically engage the bump bonding pads. This test method provides a process advantage in that the bump bonding pads are typically plated with a non-oxidizing metal (e.g., gold) such that low resistance electrical connections can be made for testing.

In a third embodiment of the invention, the components comprise semiconductor dice contained on a wafer. The contacts comprise contact bumps formed on the die bond pads using a stenciling process. For performing the stenciling process, a stencil mask is formed on the wafer by depositing a polymer layer which is patterned with openings using a laser scanner programmed with test data from the testing step. Using the stencil mask, a conductive material, such as solder or a conductive polymer in viscous form, is squeegeed into the openings, and then heated to bond the material to the bond pads. The stencil mask is then stripped leaving the contact bumps. A system for performing the third embodiment includes a wafer prober for testing the dice, a laser scanner for patterning the polymer layer, and a furnace for heating the squeegeed conductive material.

In a fourth embodiment of the invention, the components comprise semiconductor dice contained on a wafer. The contacts comprise contact bumps formed by bonding preformed solder balls to the die bond pads using a reflow process. For performing the reflow process a ball alignment tool includes a polymer film which is patterned with openings using a laser scanner programmed with test data from the testing step. The openings in the polymer film are in flow communication with a vacuum and function to hold the solder balls on the die bond pads during reflow bonding in a furnace. A system for performing the fourth embodiment includes a wafer prober for testing the dice, a laser scanner for patterning the polymer film, the ball alignment tool for aligning and retaining the solder balls on the component contacts, and a furnace for reflowing the solder balls.

BRIEF DESCRIPTION OF THE DRAWINGS

FIG. 2A is a plan view taken along line 2A—2A of FIG. 1A illustrating the substrate and the components on the substrate;

FIG. 2B is a plan view taken along line 2B—2B of FIG. 1C illustrating the substrate following fabrication of the bumped contacts on the components;

FIG. 2C is an enlarged cross sectional view taken along section line 2C—2C of FIG. 2A illustrating component contacts (bond pads) on a component;

FIG. 2D is an enlarged view of a portion of FIG. 2A taken along line 2D illustrating the component contacts on several components;

FIG. 2E is an enlarged cross sectional view taken along section line 2E—2E of FIG. 2B illustrating the contact bumps on the component contacts;

FIG. 2F is an enlarged view of a portion of FIG. 2B taken along line 2F illustrating the contact bumps and the component contacts;

FIG. 5A is an enlarged plan view taken along line 5A—5A of FIG. 4A illustrating a pattern of conductors and component contacts (bump bonding pads) on the substrate;

FIG. 5B is an enlarged cross sectional view taken along section line 5B—5B of FIG. 5A illustrating a conductor on the substrate;

FIG. 5C is an enlarged cross sectional view taken along section line 5C—5C of FIG. 5A illustrating a component contact on the substrate;

FIG. 6 is a block diagram of a system configured to perform the method illustrated in FIGS. 4A–4D;

DETAILED DESCRIPTION OF THE PREFERRED EMBODIMENTS

Referring to FIGS. 1A–1C, FIGS. 2A–2F, and FIGS. 3–3A, a method for fabricating contacts on semiconductor components in accordance with a first embodiment of the invention are illustrated. As used herein the term "semiconductor component" refers to an element or assembly that includes one or more semiconductor dice. In illustrative embodiments, the components comprise semiconductor dice, or semiconductor packages (e.g., chip scale packages or minimally packaged dice).

Figure 1A:
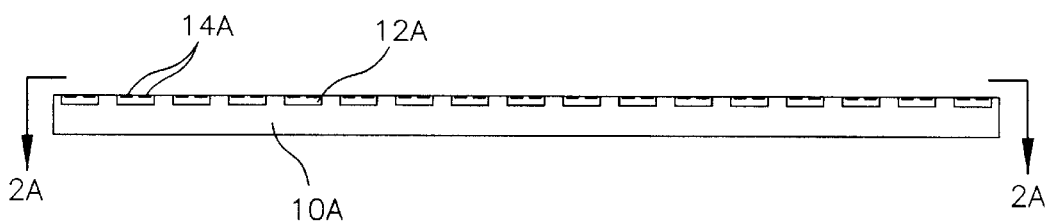
FIGS. 1A–1C are schematic cross sectional views illustrating steps in a first embodiment of the invention wherein contact bumps are fabricated on semiconductor components (dice) contained on a substrate (wafer)

Initially, as shown in FIG. 1A, a semiconductor substrate 10A containing a plurality of semiconductor components 12A is provided. In this first embodiment, the substrate 10A comprises a wafer, or a portion thereof, made of a conventional semiconductor material, such as silicon or gallium arsenide. The components 12A comprise semiconductor dice which have been formed on the substrate 10A using well known processes, such as doping, CVD and etching. In addition, the components 12A include integrated circuits (not shown) and component contacts 14A, such as bond pads, in electrical communication with the integrated circuits contained on the components 12A. FIGS. 2A, 2C and 2D, schematically illustrate the configuration of the component contacts 14A on individual components 12A. However, these illustrations are merely schematic, and the components 12A can contain any number of components contacts 14A in any suitable configuration.

Figure 1B:
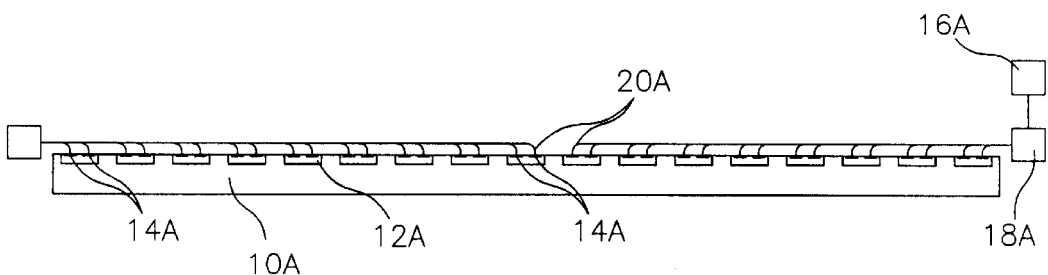

Next, as shown in FIG. 1B, the components 12A are tested on the substrate 10A to "evaluate" the components 12A, and to "map" the locations of the components 12A on the substrate 10A. For example, the testing step can be used to "identify" defective components 12A–D and to "locate" the defective components 12A–D, as well as the "good" components 12A. The testing step can be performed using techniques and equipment that are known in the art.

As used herein the term "evaluate" means to measure or assess various physical or electrical characteristics of the components 12A relative to a predetermined criteria. The term "map" means to determine a location of "defective" and "good" components on the substrate.

The term "defective component" means a component having electrical characteristics that do not meet the predetermined criteria. For example, physical and electrical defects, such as short circuits, open circuits, leaking contacts, and cracked insulating layers, can make a component nonfunctional and thus defective. Alternately, a functional component may not have an identifiable physical or electrical defect, yet can still be considered defective for a particular application. For example, a component that does not meet a required standard for speed may be considered "functional" yet "defective" for making chip scale packages. However, the component may not be defective for other applications, such as making conventional plastic semiconductor packages.

The term "good component" means a component having electrical characteristics that meet the predetermined criteria.

Figure 3:
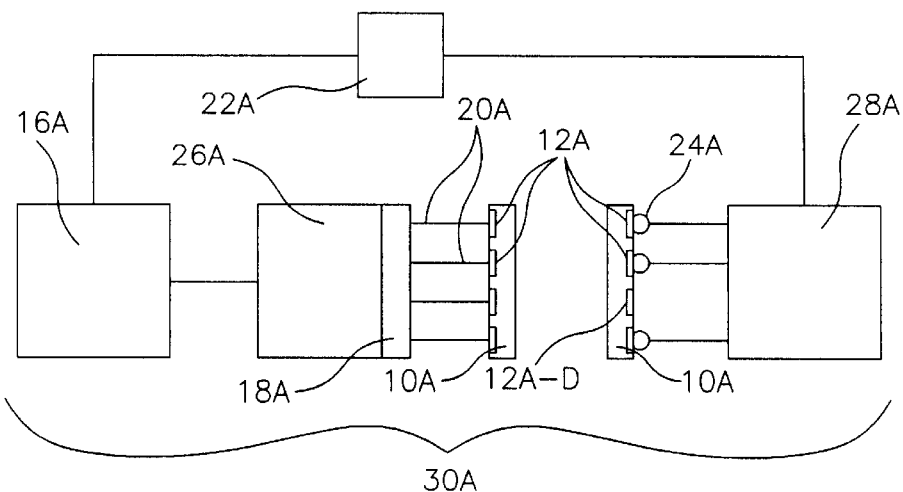
FIG. 3 is a block diagram of a system configured to perform the method illustrated in FIGS. 1A–1C.

One well known wafer level test is referred to as wafer probe. As shown in FIG. 1B, for performing a wafer probe, a tester containing test circuitry 16A is provided. The test circuitry 16A is configured to generate and apply test signals to the integrated circuits and electrical devices contained on the components 12A. The test circuitry 16A is also configured to generate, compile and store test data 22A (FIG. 3).

Also provided is a probe card 18A in electrical communication with the test circuitry 16A. The probe card 18A includes probe contacts 20A configured to electrically engage the component contacts 14A, and to provide separate electrical paths for applying the test signals to the components 12A.

In general, the test circuitry 16 can be configured to test various electrical characteristics of the components 12A. One electrical characteristic that can be evaluated is the "gross functionality" of each component 12A. Such a test can include powering up an individual component 12A, and then performing write, modify, or read operations on each of the data paths (i.e., DQs) into and out of the component 12A. For example, in the case of a 4× die, zeros can be written to each of the four DQ's (four memory cells) and read. Next, the zeros can be changed to "1s" and checked to confirm the change has occurred. If the change occurs, the die is referred to as being "grossly" functional.

As another example, the test circuitry 16A can be configured to detect cell to cell defects in components 12A that contain memory cells. To detect cell to cell defects, high voltage values (logical "1") can be written to selected memory cells of an individual component 12A. At the same time low voltage values (logical "0") can be written to adjacent memory cells. The test circuitry 16A then determines whether the adjacent memory cells maintain a logical "0" value. If not, then the logical "1" value written to the selected memory cells has shorted, indicating a cell defect.

Another test that can be performed using the test circuitry 16 (FIG. 1B) is known as a "Walking 1" test. With a "Walking 1" test, an entire array on a component 12A is set to zeros and a "1" is written to the first address. The "1" is then read. As a next step, the entire array is set to zeros, a "1" is written to the second address, and then read. This procedure is repeated through all of the addresses of the array.

The test circuitry 16A can also be configured to test for opens, shorts, and current leakage between the component contacts 14A on each component 12A. Opens and shorts can be detected using a continuity circuit configured to test for opens and shorts between selected component contacts 14A.

In general, each of the above test procedures is referred to as "functional testing". However, the testing step can also include "parametric testing" such as speed grading or bin sorting. In this case the electrical characteristics relative to the "performance" of the components are evaluated. The parametric testing can be used to identify defective components 12A–D on the substrate 10A that are functional, but which may not possess certain characteristics. For example, some of the components 12A may be faster than other of the components 12A–D and more suitable for particular applications. In general, the faster components are termed as "premium" components, and command a higher price. Other of the components 12A–D may be completely functional, yet not able to meet premium standards.

Whatever test procedure is employed, the test data 22A (FIG. 3) from the testing step is retained. For example, the test data 22A can be retained in digital form as computer software.

Figure 1C:
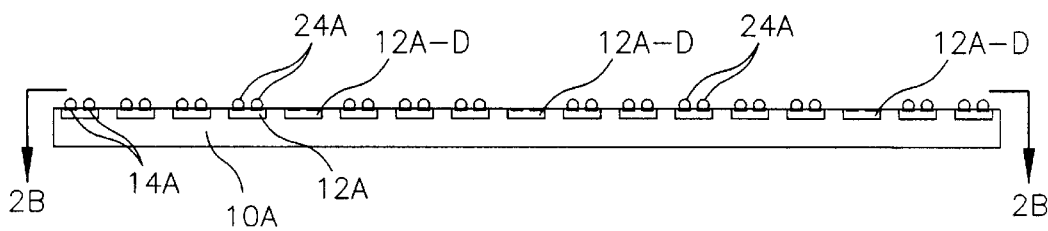

As shown in FIG. 1C and in FIGS. 2B–2F, following the initial wafer level test to evaluate the components 12A, contact bumps 24A are formed on the components 12A, but not on the defective components 12A–D.

As used herein, the term "contact bump" refers to a raised or bumped contact on a semiconductor component. The contact bump can comprise any electrically conductive material such as solder, metal or a conductive polymer. In addition, the contact bump can have any suitable shape such as spherical, hemispherical, dome, rectangular, square, conical, truncated conical, pyramidal, truncated pyramidal, inverted pyramidal, columnar, stud or elongated stud.

Figure 3A:
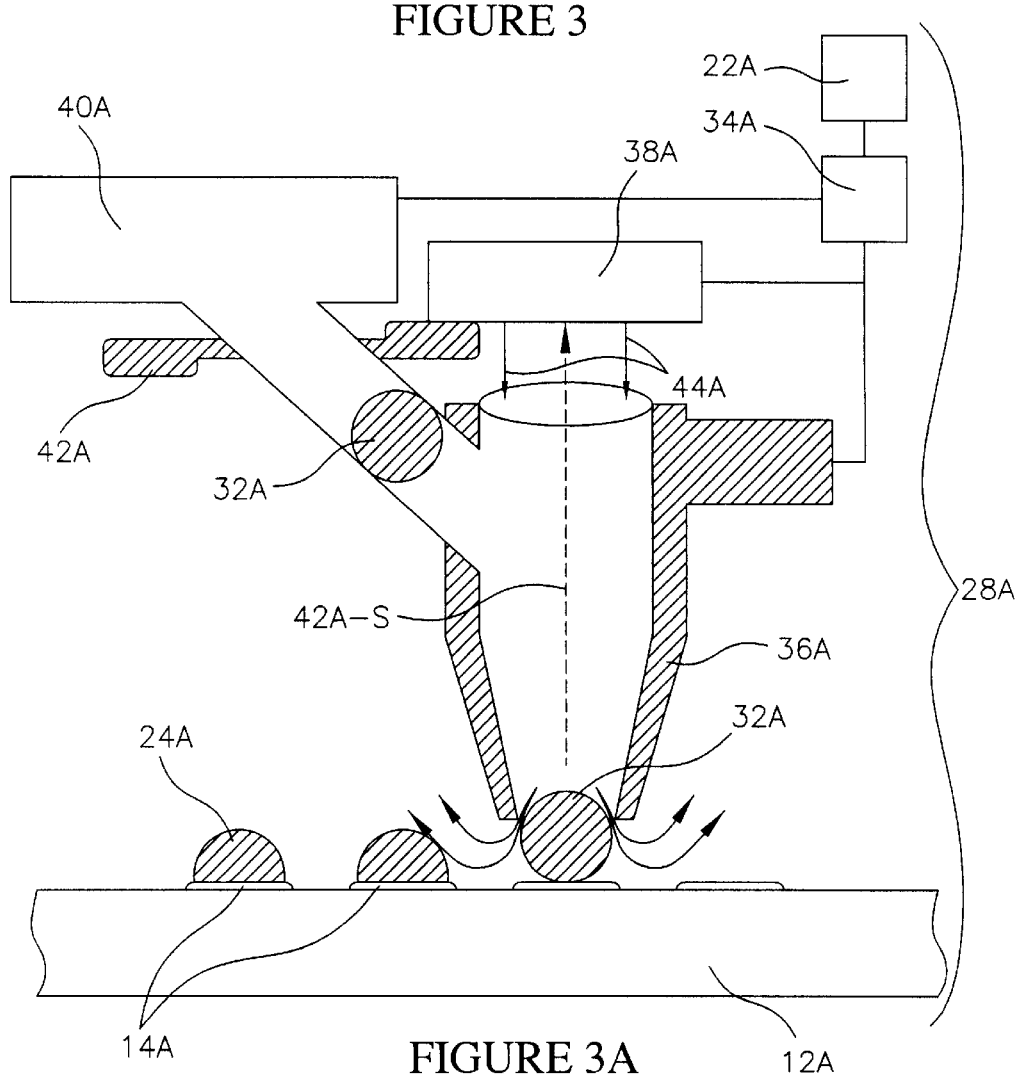
FIG. 3A is a schematic cross sectional view of a ball bumper apparatus of the system of FIG. 3.

Referring to FIGS. 3 and 3A, a system 30A for performing the method outlined in FIGS. 1A–1C is illustrated. The system 30A includes a test apparatus 26A, such as a wafer prober, that includes the probe card 18A having the probe contacts 20A configured to electrically engage the components 12A on the substrate 10A. The probe card 18A is in electrical communication with test circuitry 16A configured to generate and transmit test signals to the components 12A, and to analyze the resultant test signals received from the components 12A. In addition, the test circuitry 16A is configured to accumulate and store the test data 22A. As previously stated, the test data 22A can be in the form of computer software.

The system 30A also includes a ball bumper apparatus 28A configured to fabricate the contact bumps 24A on the components 12A, but not on the defective components 12A–D. Suitable ball bumper apparatuses are commercially available from Pac Tech Packaging Technologies, of Nauen, Germany, and from Kulicke and Soffa Investments Inc. of Wilmington, Del.

As shown in FIG. 3A, the ball bumper apparatus 28A includes a capillary device 36A configured to place preformed solder balls 32A from a reservoir 40A onto the component contacts 14A. A detection device 42A associated with the capillary device 36A detects for proper alignment between the capillary device 36A and the component contacts 14A and sends signals 42A–S to indicate proper alignment. The ball bumper apparatus 28A also includes a laser 38A configured to direct laser energy 44A through the capillary device 36A to reflow and bond the solder balls 32A to the component contacts 14A.

The ball bumper apparatus 28A also includes a controller 34A such as a computer configured to control and coordinate the operation of the capillary device 36A, the laser 38A and the reservoir 40A. In addition, the controller 34A is configured to receive the test data 22A from the testing step and to operate the capillary device 36A, the laser 38A and the reservoir 40A, such that the contact bumps 24A are fabricated on only the good components 12A. For example, the test data 22A can indicate the locations of the defective components 12A–D, and the locations of the "good" components 12A on the substrate 10A. With this system 30A only the good components 12A are bumped such that time and materials are not wasted on the defective components 12A–D. The system 30A thus simplifies and speeds up the bump formation process.

Referring to FIGS. 4A–4D and to FIGS. 5A–5C, a second embodiment method for fabricating contact bumps 24B (FIG. 4D) on a semiconductor component 12B (FIG. 4D) is illustrated. In this embodiment, the contact bumps 24B comprise solder bumps or balls, in a ball grid array or a fine ball grid array, and the semiconductor component 12B comprises a board-on-chip (BOC) semiconductor package.

However, the semiconductor component 12B can comprise another type of semiconductor package such as a chip-on-board (COB) package, a chip scale package (CSP), or a BGA device.

Figure 4A:
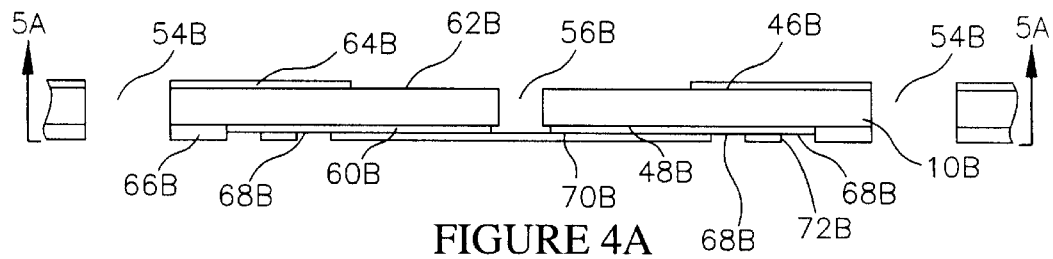
FIGS. 4A–4D are schematic cross sectional views illustrating steps in a second embodiment of the invention wherein contact bumps are fabricated on semiconductor components (packages) contained on a substrate (panel)

Initially, as shown in FIG. 4A, a substrate 10B is provided. As shown in FIG. 5A, the substrate 10B can initially comprise a segment of a panel 50B. The panel 50B (FIG. 5A) is similar in function to a semiconductor lead frame, and includes multiple substrates 10B permitting the fabrication of multiple components 12B (FIG. 4D) at the same time. The panel 50B includes circular indexing openings 52B (FIG. 5A) proximate to the longitudinal edges thereof. The indexing openings 52B permit the panel 50B to be handled by automated transfer mechanisms associated with chip bonders, wire bonders, molds, and trim machinery. In addition, the panel 50B includes elongated separation openings 54B (FIG. 5A) which facilitate singulation of the substrates 10B on the panel 50B into separate components 12B (FIG. 4D).

The substrate 10B can comprise an electrically insulating material such as an organic polymer resin reinforced with glass fibers. Suitable materials for the substrate 10B include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the substrate 10B can be from about 0.2 mm to 1.6 mm.

As shown in FIG. 4A, the substrate 10B includes a first surface 46B, and an opposing second surface 48B. The first surface 46B, and the second surface 48B, are the major planar surfaces of the substrate 10B. The substrate 10B also includes a wire bonding opening 56B there through, extending from the first surface 46B to the second surface 48B. In addition, the substrate 10B includes a pattern of conductors 60B formed on the second surface 48B, and a corresponding die attach area 62B formed on the first surface 46B.

As shown in FIG. 5A, the conductors 60B include bump bonding pads 68B and wire bonding pads 70B. As shown in FIG. 5C, the bump bonding pads 68B, (and also the wire bonding pads 70B-FIG. 5A), can include a non-oxidizing layer such as gold or platinum. The substrate 10B also includes a solder mask 64B (FIG. 4A) on the first surface 46B, and a solder mask 66B on the second surface 48B. As shown in FIG. 5C, the solder mask 66B includes openings 72B aligned with the bump bonding pads 68B (and also with the wire bonding pads 70B-FIG. 5A). The solder masks 64B and 66B can comprise a photoimageable material such as photoresist patterned with the openings 72B.

Figure 4B:
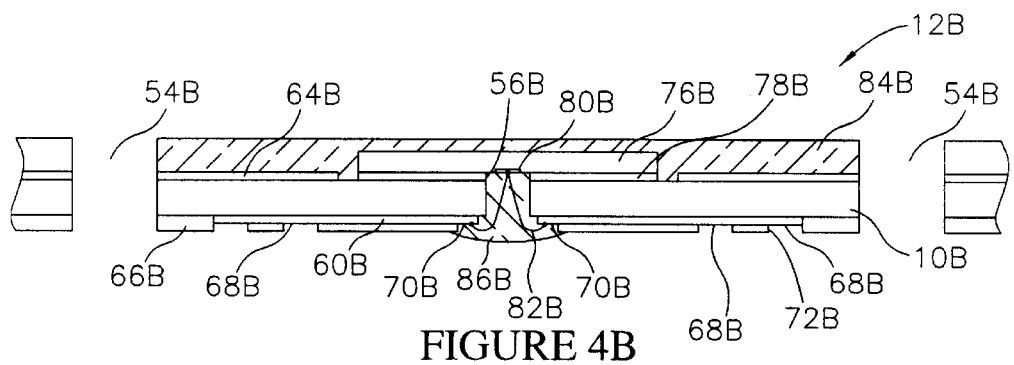

Next, as shown in FIG. 4B, a semiconductor die 76B is attached circuit side down to the substrate 10B using an adhesive layer 78B. A conventional die attacher can be used to attach the die 76B to the substrate 10B. Die bond pads 80B are aligned with the wire bonding opening 56B on the substrate 10B. In addition, wires 82B are placed through the wire bonding opening 56B, and are wire bonded to the die bond pads 80B and to the wire bonding pads 70B on the conductors 60B. A die encapsulant 84B, such as a Novoloc epoxy, formed using transfer molding or other process, encapsulates the die 76B. A wire bond encapsulant 86B, such as a glob top material, (e.g., silicone) encapsulates the wires 82B.

Figure 4C:
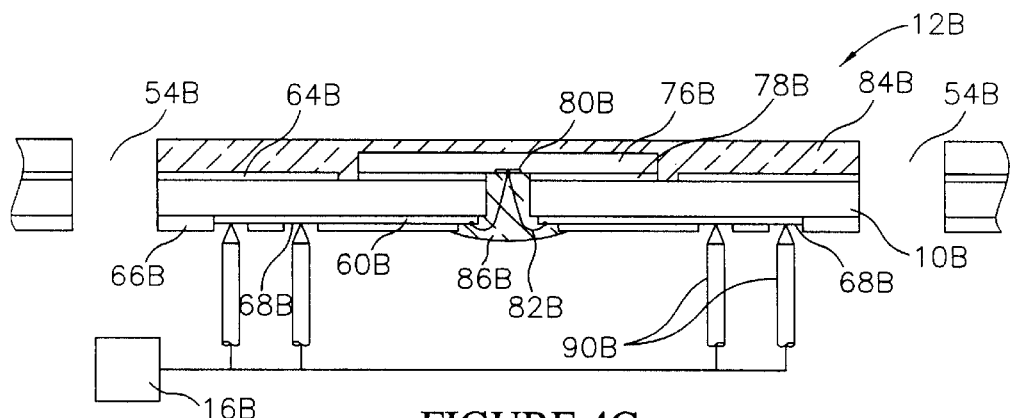
Figure 4D:
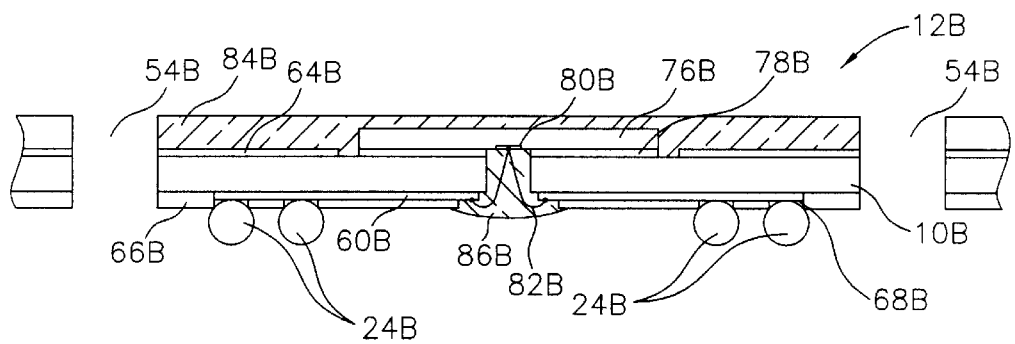

Next, as shown in FIG. 4C, a testing step is performed on all of the components 12B contained on the panel 50B. The testing step can be performed using a test socket 88B (FIG. 6) having an arrangement of spring loaded electrical connectors 90B, such as "POGO PINS", in electrical communication with test circuitry 16B. The electrical connectors 90B electrically engage the bump bonding pads 68B on the substrate 10B. Because the bump bonding pads 68B have the non-oxidizing layer 74B (FIG. 5C) low resistance electrical connections are assured. This is a departure from conventional testing processes wherein solder terminal contacts are electrically engaged but have oxide layers that can compromise the electrical connections with the testing apparatus.

The testing step can include functional and parametric testing of the die 76B, and of the component 12B, substantially as previously described. As with the previous embodiment, test data 22B (FIG. 6) is compiled and stored during the testing step. The test data 22B will be used to evaluate and map the locations of the good components 12B on the panel SOB. Only those components that meet a predetermined criteria will have the contact bumps 24B fabricated thereon.

Next, as shown in FIG. 4D, the contact bumps 24B are formed on the bump bonding pads 68B using a ball bumper apparatus 28B (FIG. 6). The ball bumper apparatus 28B can be configured substantially as previously described for ball bumper apparatus 28A, to use the test data 22B to bump only the good components 12B.

Referring to FIG. 6, a system 30B for performing the method outlined in FIGS. 4A–4D is illustrated. The system 30B includes a test apparatus 92B that includes the test socket 88B having the electrical connectors 90B configured to electrically engage the bump bonding pads 68B on the components 12B contained on the substrate 10B. The electrical connectors 90B are in electrical communication with test circuitry 16B configured to generate and transmit test signals to the components 12B, and to analyze the resultant test signals received from the components 12B. In addition, the test circuitry 16B is configured to accumulate and store the test data 22B. As before, the test data 22B can be in the form of computer software. The system 30B also includes the ball bumper apparatus 28B configured to fabricate the contact bumps 24B on the components 12B that meet the predetermined criteria, but not on the defective components 12B that do not meet the criteria.

Figure 7A:
FIGS. 7A–7G are schematic cross sectional views illustrating steps in a third embodiment of the invention wherein contact bumps are fabricated on semiconductor components (dice) contained on a substrate (wafer)

Referring to FIGS. 7A–7J, a third embodiment method for fabricating contact bumps 24C (FIG. 7J) on a semiconductor component 12C contained on a substrate 10C is illustrated. In this embodiment the substrate 10C comprises a semiconductor wafer and the components 12C comprise semiconductor dice, substantially as previously described for the first embodiment. As shown in FIG. 7A, the components 12C include component contacts 14C in electrical communication with the integrated circuits contained thereon.

Figure 7B:
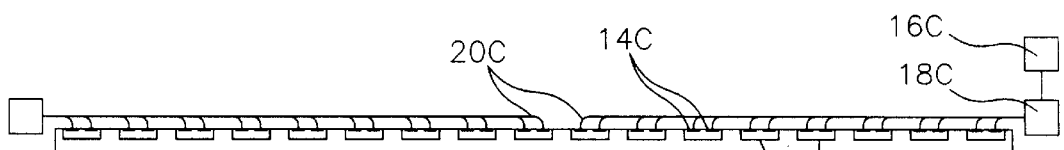

As shown in FIG. 7B, the components 12C on the substrate 10C are initially tested using a probe card 18C having probe contacts 20C in electrical communication with test circuitry 16C. The testing step can be performed substantially as previously described for the testing step in the first embodiment.

Figure 7C:
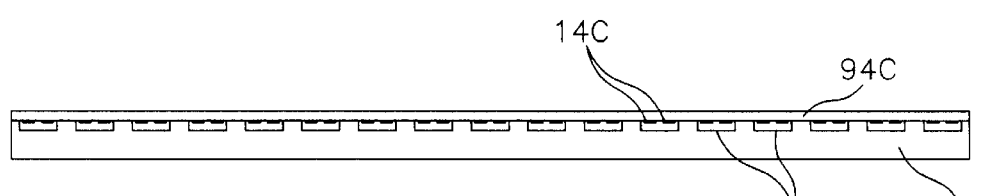

Next, as shown in FIG. 7C, a polymer layer 94C is formed on the substrate 10C. The polymer layer 94C covers the components 12C and the component contacts 14C as well. As will be further explained, the polymer layer 94C will be used to form a stencil mask for fabricating the contact bumps 24C (FIG. 7J) on the component contacts 14C. The polymer layer 94C can comprise a curable material, such as polyimide, or a photoimageable resist, deposited in viscous form to a desired thickness (e.g., 0.5 µm to 75 µm) and then cured to harden. The polymer layer 94C can also comprise a tape material such as "KAPTON" tape from DuPont, that is cut to size and adhered to the substrate 10C.

Figure 7D:
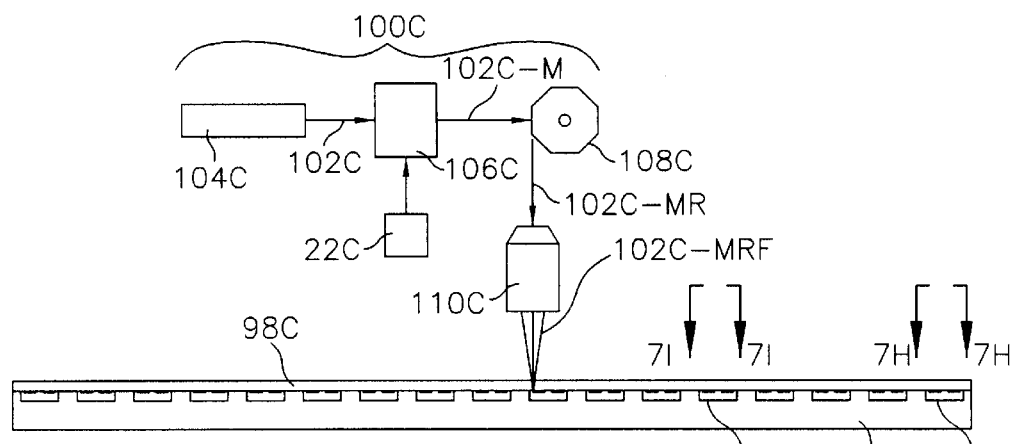
Figure 7I:
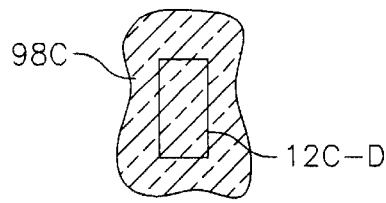
FIG. 7I is an enlarged plan view of a portion of FIG. 7D taken along line 7I—7I illustrating a portion of the polymer stencil proximate to a defective component.
Figure 7H:
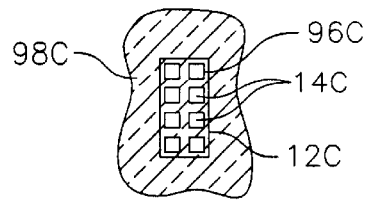
FIG. 7H is an enlarged plan view of a portion of FIG. 7D taken along line 7H—7H illustrating a polymer stencil on the substrate and openings in the stencil.

Next, as shown in FIG. 7D, the polymer layer 94C (FIG. 7C) is patterned with openings 96C (FIG. 7H) using a laser scanner 100C to form a stencil mask 98C. As shown in FIG. 7H, the stencil mask 98C includes patterns of openings 96C aligned with the component contacts 14C on the good components 12C. As shown in FIG. 7I, the stencil mask 98C completely covers the defective components 12C–D and the component contacts 14C thereon.

The laser scanner 100C can comprise a commercially available unit available from a manufacturer such as Etec Systems, Inc., of Hayward, Calif. and Tucson, Ariz. One suitable laser scanner is manufactured by Etec Systems, Inc. is the "DIGIRITE 2000" UV Laser Direct Imaging System. Another laser scanner is manufactured by General Scanning of Sommerville, Mass., and is designated a Model No. 670-W.

As shown in FIG. 7D, the laser scanner 100C includes a laser 104C configured to generate a laser beam 102C. For example, the laser beam 102C can comprise ultraviolet light at a selected wavelength (e.g., 325 nm (nanometers) or 363.8 nm), pulsed at a frequency of from 1 to 300 MHz. The laser scanner 100C also includes a modulator 106C having an optical input port configured to receive the laser beam 102C. In addition, the modulator 106C includes an electrical input port configured to receive digital data (i.e., software) that includes the test data 22C from the testing step.

Still referring to FIG. 7D, the laser scanner 100C also includes a rotating polygon 108C configured to receive a modulated laser beam 102C–M from the modulator 106C. The rotating polygon 108C includes reflective facets which transmit a modulated and reflected laser beam 102C-MR onto a scan lens 110C. The scan lens 110C focuses modulated, reflected and focused laser beams 102C-MRF onto the polymer layer 94C (FIG. 7C) to ablate the openings 96C (FIG. 7H) in a required pattern and size. Alternately, with the polymer layer 94C (FIG. 7C) comprising a photoimageable resist. The modulated, reflected and focused laser beam 102C-MRF exposes the polymer layer 94C (FIG. 7C) such that following a subsequent development step, the desired pattern of openings 96C (FIG. 7H) is contained on the stencil mask 98C. The size and shape of the openings 96C will determine the size and shape of the contact bumps 24C. By way of example a representative range for the diameter of the openings 96C and the contact bumps 24C can be from 0.127 mm (0.005 inch) to 0.762 mm (0.030 inch) on a pitch P of from about 0.228 mm (0.008 inch) to 2.0 mm (0.078 inch).

Figure 7E:
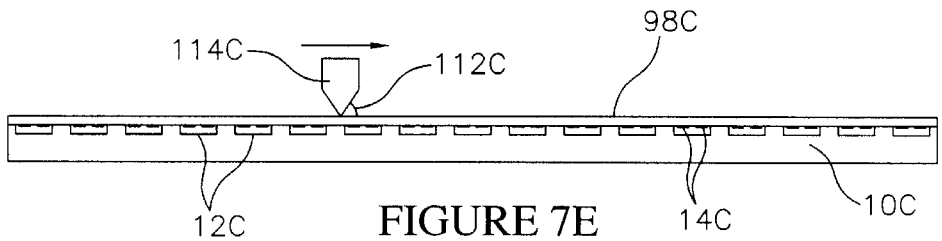

Next, as shown in FIG. 7E, a conductive material 112C in viscous form, such as solder or a conductive polymer, is deposited into the openings 96C in the stencil mask 98C, and onto the component contacts 14C, using squeegee 114C.

Figure 7F:
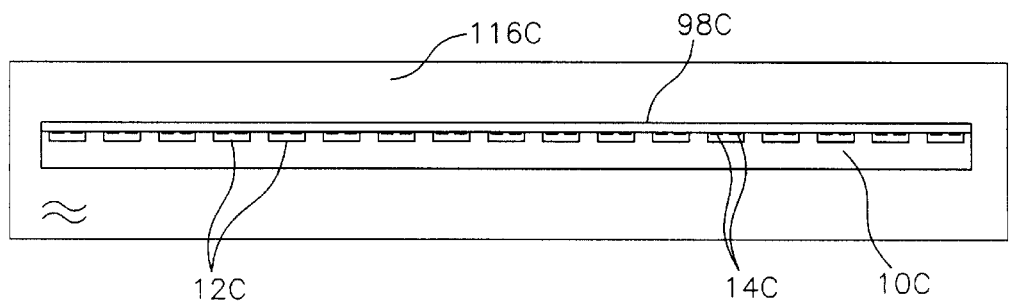

Next, as shown in FIG. 7F, the substrate 10C is placed in a furnace 116C configured to heat the conductive material 112C in the openings 96C on the stencil mask 98C to a temperature sufficient to bond the conductive material 112C to the component contacts 14C (e.g., 150° C. to 200° C. for solder). Preferably the furnace 116C comprises a controlled atmosphere vacuum furnace which is purged of oxygen.

Figure 7G:
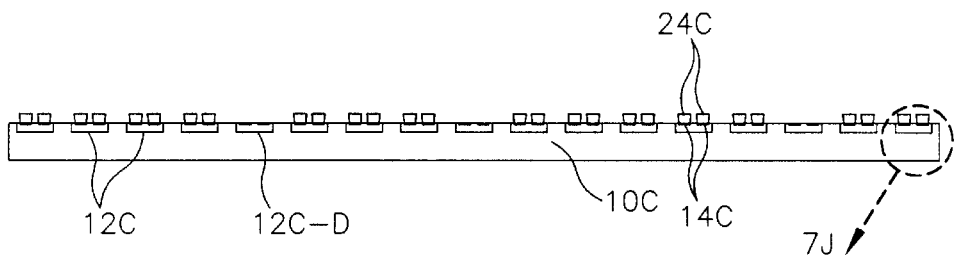
Figure 7J:
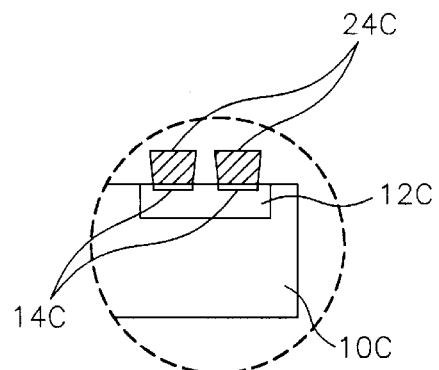
FIG. 7J is an enlarged view of a portion of FIG. 7G taken along line 7J illustrating contact bumps on a semiconductor component.

Next, as shown in FIG. 7G, the stencil mask 98C is stripped leaving the contact bumps 24C. Depending on the material of the polymer layer 94C, a suitable wet stripper can be used to strip the stencil mask 98C from the substrate 10C. The contact bumps 24C are formed only on the components 12C that meet the predetermined criteria, and not on the defective components 12C–D. As shown in FIG. 7J, the contact bumps 24C have generally tapered sidewalls that correspond to the generally conical shape of the openings 96C in the stencil mask 98C.

Figure 8:
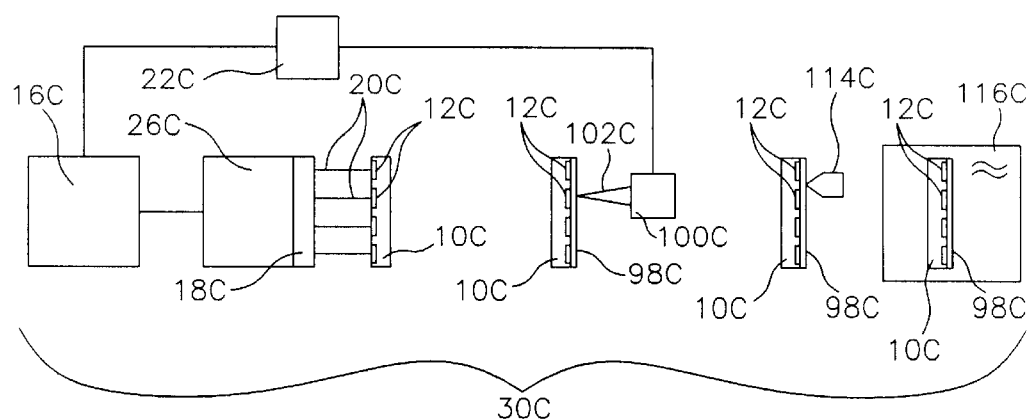
FIG. 8 is a block diagram of a system configured to perform the method illustrated in FIGS. 7A–7J.

Referring to FIG. 8, a system 30C for performing the method outlined in FIGS. 7A–7J is illustrated. The system 30C includes a test apparatus 26C, such as a wafer prober, that includes the probe card 18C having the probe contacts 20C configured to electrically engage the component contacts 14C on the components 12C contained on the substrate 10C. The probe contacts 20C are in electrical communication with the test circuitry 16C configured to generate and transmit test signals to the components 12C, and to analyze the resultant test signals received from the components 12C. In addition, the test circuitry 16C is configured to accumulate and store the test data 22C. As before, the test data 22C can be in the form of computer software. The system 30C also includes the laser scanner 100C configured to generate the laser beam 102C for forming the stencil mask 98C with openings 96C that align with the component contacts 14C on the good components 12C, while the defective components 12C–D remain covered. The system 30C also includes the squeegee 114C for stenciling the conductive material 112C into the openings 96C, and the furnace 116C for heating the conductive material 112C for bonding to the component contacts 14C.

Figure 9A:
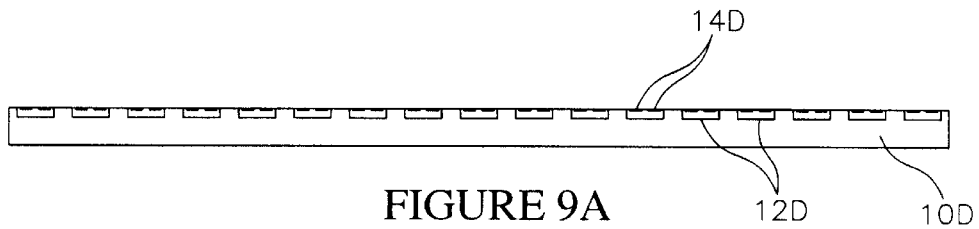
FIGS. 9A–9F are schematic cross sectional views illustrating steps in a fourth embodiment of the invention wherein contact bumps are fabricated on semiconductor components contained on a substrate (wafer)

Referring to FIGS. 9A–9J, a fourth embodiment method for fabricating contact bumps 24D (FIG. 9I) on a semiconductor component 12D contained on a substrate 10D is illustrated. In this embodiment the substrate 10D comprises a semiconductor wafer and the components 12D comprise semiconductor dice, substantially as previously described for the first and third embodiments. As shown in FIG. 9A, the components 12D include component contacts 14D in electrical communication with the integrated circuits contained thereon.

Figure 9B:
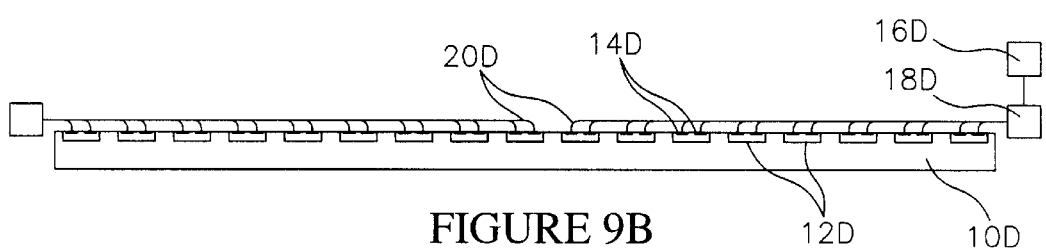

As shown in FIG. 9B, the components 12D on the substrate 10D are initially tested using a probe card 18D having probe contacts 20D in electrical communication with test circuitry 16D. The testing step can be performed substantially as previously described for the testing step in the first embodiment.

Figure 9C:
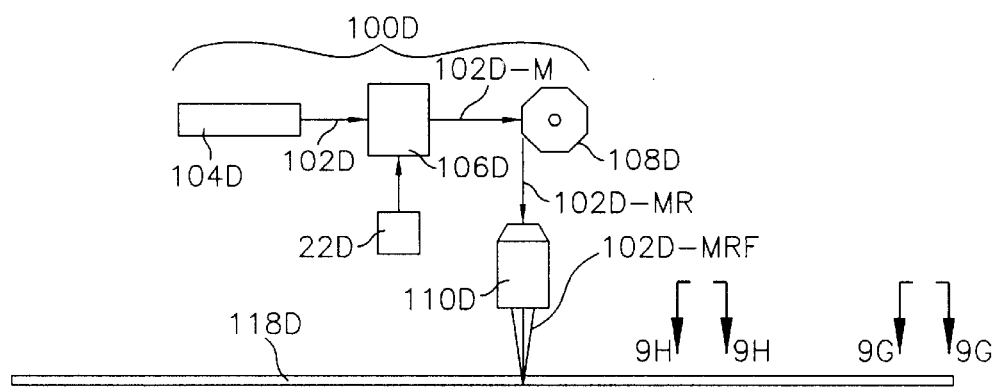

Next, as shown in FIG. 9C, a polymer film 118D is patterned with openings 120D (FIG. 9G) using a laser scanner 100D. In this case the polymer film 118D comprises a thin flexible film material such as acetate, a polyimide tape, or "KAPTON" tape. The patterned polymer film 118D will be used as an element of a ball alignment tool 122D (FIG. 9D) to be hereinafter described. Preferably the polymer film 118D has a thickness that is approximately equal to, but less than a height of the pre-formed solder balls 32D (FIG. 9D) which are to be retained as will be subsequently described.

Figure 9H:
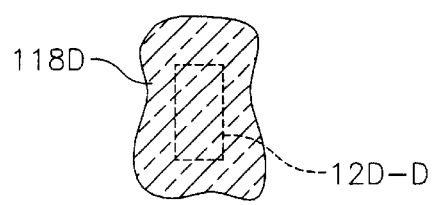
FIG. 9H is an enlarged plan view of a portion of FIG. 9C taken along line 9H—9H illustrating a portion of the polymer film proximate to a defective component.
Figure 9G:
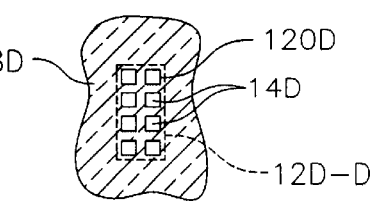
FIG. 9G is an enlarged plan view of a portion of FIG. 9C taken along line 9G—9G illustrating a polymer film patterned with openings proximate to a good component.

As shown in FIG. 9G, with the substrate 10D mounted on the ball alignment tool 122D, the openings 120D on the polymer film 118D align with the component contacts 14D on the good components 12D. However, as shown in FIG. 9H, there are no openings in the polymer film 118D wherein defective components 12D-D are located.

As shown in FIG. 9C, a laser scanner 100D, constructed substantially as previously described, can be used to pattern the polymer film 118D with the openings 120D (FIG. 9G) The openings 120D are generally conically shaped as is consistent with a laser formation process. In addition, the openings 120D extend completely through the polymer film 118D and have a diameter at their largest point that is less than a diameter of the pre-formed solder balls 32D (FIG. 9D), such that the solder balls 32D are retained in the openings 120D, but do not fall through the openings 120D.

A support substrate (not shown) can be used to support the polymer film 118D (FIG. 9C) during laser patterning. As shown in FIG. 9C, the laser scanner 100D includes a laser 104D configured to generate a laser beam 102D. The laser scanner 100D also includes a modulator 106D having an optical input port configured to receive the laser beam 102D. In addition, the modulator 106D includes an electrical input port configured to receive digital data (i.e., software) that includes the test data 22D from the testing step.

Still referring to FIG. 9C, the laser scanner 100D also includes a rotating polygon 108D configured to receive a modulated laser beam 102D–M from the modulator 106D. The rotating polygon 108D includes reflective facets which transmit a modulated and reflected laser beam 102D-MR onto a scan lens 110D. The scan lens 110D focuses modulated, reflected and focused laser beams 102D-MRF onto the polymer layer 118D to ablate the openings 120D (FIG. 9G) in a required pattern and size.

Figure 9D:
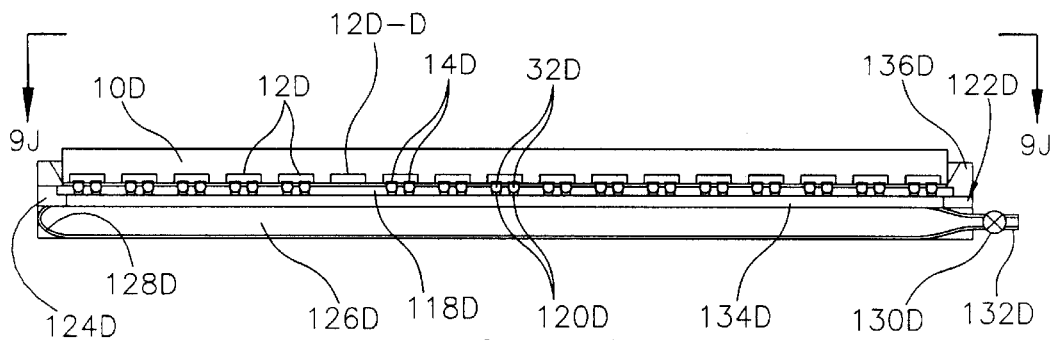

As shown in FIG. 9D, the ball alignment tool 122D includes a base 124D wherein the polymer film 118D is mounted. The base 124D includes a vacuum chamber 126D configured to apply a vacuum through a porous plate 134D to the openings 120D formed in the polymer film 118D. The vacuum functions to hold the pre-formed solder balls 32D in the openings 120D. In addition, the openings 120D have a generally conical shape from the laser formation process and are sized such that retention of the solder balls 32D is enhanced. As there are no openings in the polymer film 118D proximate to defective components 12D-D, no solder balls 32D are aligned with the defective components 12D-D.

The base 124D of the ball alignment tool 122D can be similar in construction to a saw chuck for wafer dicing, in that a separate peripheral vacuum ring (not shown) can be provided for retaining the polymer film 118D on the base 124D. The base 124D also includes a valve 130D and a connector 132D configured for connection to a vacuum source (not shown). In addition, the base 124D includes a sealed bladder 128D within the vacuum chamber 126D that permits the vacuum to be preserved in the vacuum chamber 126D without the vacuum source, once the solder balls 32D have been seated in the openings 120D. For loading the balls onto the polymer film 118D a ball loader mechanism comprising a squeegee and a screen (not shown) can be used. Such a loader mechanism, and a ball retaining plate similar to the ball alignment tool 122D, are further described in U.S. Pat. No. 6,100,175 to Wood et al., which is incorporated herein by reference.

The base 124D also includes an alignment member 136D configured to contact peripheral edges of the substrate 10D to align the substrate 10D to the polymer film 118D. As shown in FIG. 9J, the alignment member 136D includes a peripheral opening 138D having an outline corresponding to the peripheral shape of the substrate 10D. In a representative operational sequence, the solder balls 32D are loaded onto the polymer film 118D and retained in the openings 120D by vacuum. The substrate 10D is then placed through the opening 138D in the alignment member 136D onto the solder balls 32D. The alignment member 136D initiates and maintains alignment of the substrate 10D and of the component contacts 14D on the substrate 10D with the solder balls 32D retained on the polymer film 118D.

Figure 9E:
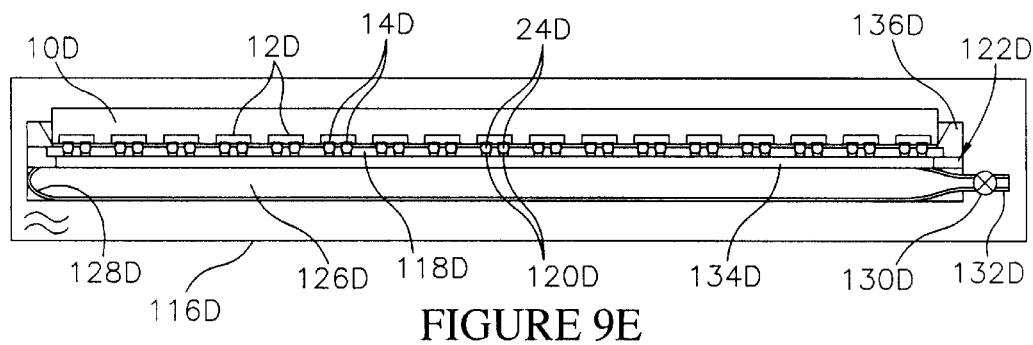

Next, as shown in FIG. 9E, the substrate 10D is placed in a furnace 116D configured to heat the solder balls 32D to a temperature sufficient to reflow and bond the solder balls 32D to the component contacts 14D to form the contact bumps 24D (e.g., 150° C. to 200° C.). Preferably the furnace 116D comprises a controlled atmosphere vacuum furnace which is purged of oxygen. In addition, solder flux (not shown) can be applied to the solder balls 32D, or to the component contacts 14D, to facilitate the reflow bonding process.

Figure 9F:
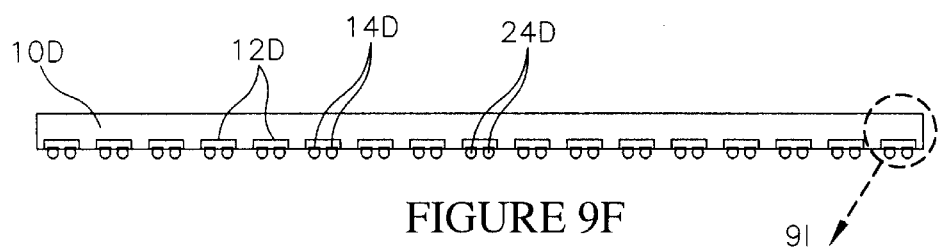
Figures 9I, 9J:
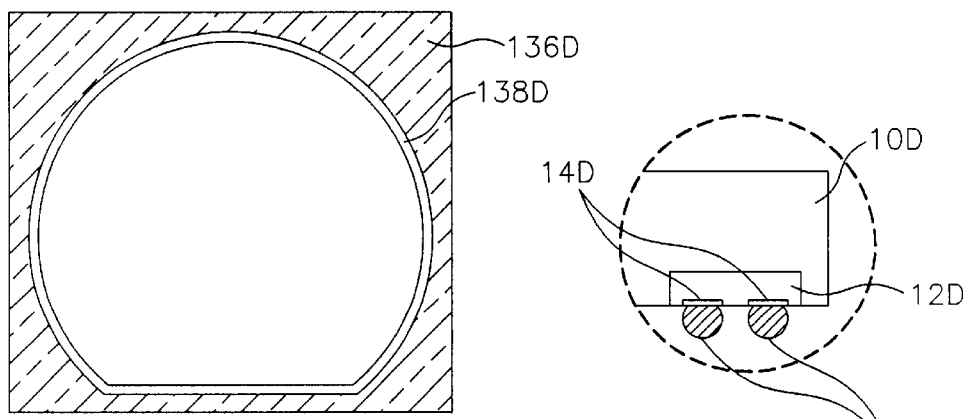
FIG. 9I is an enlarged view of a portion of FIG. 9F taken along line 9I illustrating contact bumps on a semiconductor component.
FIG. 9J is a cross sectional view taken along section line 9J—9J of FIG. 9D illustrating an alignment member of a ball alignment tool.

Next, as shown in FIG. 9F, the substrate 10D is removed from the ball alignment tool 122D with the contact bumps 24D bonded to the component contacts 14D on the good components 12D. As shown in FIG. 9I, the contact bumps 24D are generally spherical in shape.

Figure 10:
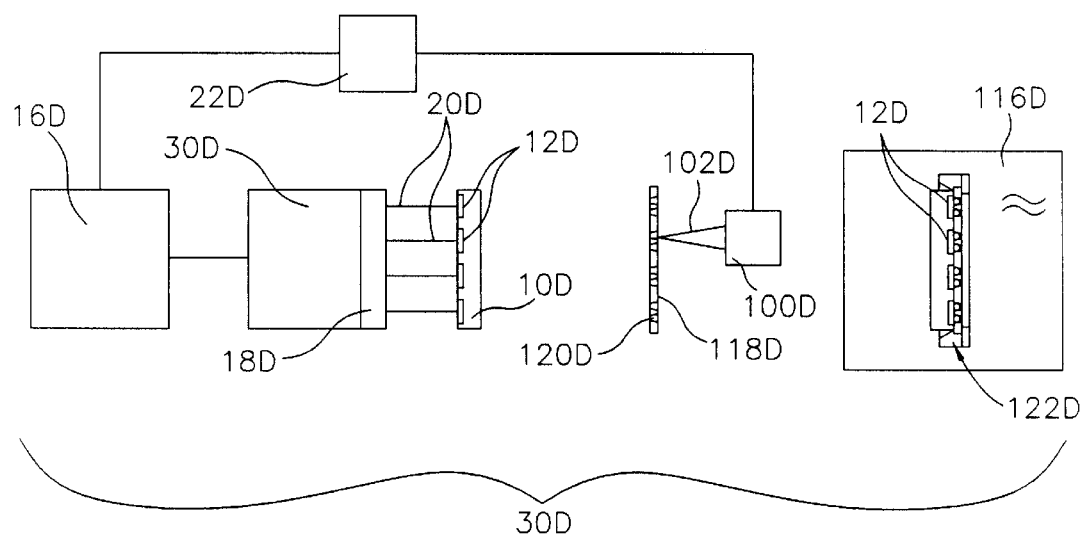
FIG. 10 is a block diagram of a system configured to perform the method illustrated in FIGS. 9A–9F.

Referring to FIG. 10, a system 30D for performing the method outlined in FIGS. 9A–9J is illustrated. The system 30D includes a wafer prober 30D that includes the probe card 18D having the probe contacts 20D configured to electrically engage the component contacts 14D on the components 12D contained on the substrate 10D. The probe contacts 20D are in electrical communication with the test circuitry 16D configured to generate and transmit test signals to the components 12D, and to analyze the resultant test signals received from the components 12D. In addition, the test circuitry 16D is configured to accumulate and store the test data 22D. The system 30D also includes the laser scanner 100D configured to generate the laser beam 102D for forming the polymer film 118D with openings 120D for retaining the solder balls 32D. The system 30D also includes the ball alignment tool 122D for retaining the component 10D in alignment with the solder balls 32D retained on the polymer film 118D. The system also includes the furnace 116D for heating the solder balls 32D for bonding to the component contacts 14D.

Thus the invention provides an improved method for fabricating contacts on semiconductor components, a system for performing the method and improved semiconductor components fabricated using the method. While the invention has been described with reference to certain preferred embodiments, as will be apparent to those skilled in the art, certain changes and modifications can be made without departing from the scope of the invention as defined by the following claims.

What is claimed is:

1. A method for fabricating contacts on semiconductor components comprising:
   providing a substrate containing the components;
   testing the component on the substrate to generate test data indicative of a location of good components that meet a predetermined criteria and of defective components that do not meet the predetermined criteria; and
   forming the contacts on the good components on the substrate but not on the defective components on the substrate using the test data;
   the forming step comprising providing a ball bumper apparatus, programming the ball bumper apparatus with the test data, and then bonding solder bumps to the good components using the ball bumper apparatus.

2. A method for fabricating contacts on semiconductor components comprising:

providing a substrate containing the components;

testing the components on the substrate to generate test data indicative of a location of good components that meet a predetermined criteria and of defective components that do not meet the predetermined criteria; and forming the contacts on the good components on the substrate but not on the defective components on the substrate using the test data;

the forming step comprising providing a laser scanner, programming the laser scanner with the test data, and then forming a stencil mask on the substrate configured to deposit metal on the good components using the laser scanner.

3. A method for fabricating contacts on semiconductor components comprising:

providing a substrate containing the components;

testing the components on the substrate to generate test data indicative of a location of good components that meet a predetermined criteria and of defective components that do not meet the predetermined criteria; and forming the contacts on the good components on the substrate but not on the defective components on the substrate using the test data;

the forming step comprising providing a laser scanner, programming the laser scanner with the test data, and then patterning a polymer film configured to place solder balls on the good components using the laser scanner.

4. A method for fabricating contacts on semiconductor components comprising:

providing a substrate containing the components;

testing the component on the substrate to generate test data indicative of a location of good components that meet a predetermined criteria and of defective components that do not meet the predetermined criteria; and forming the contacts on the good components on the substrate but not on the defective components on the substrate using the test data;

wherein the components comprise semiconductor dice, the substrate comprises a semiconductor wafer and the testing step is performed using a wafer prober.

5. A method for fabricating contacts on semiconductor components comprising:

providing a substrate containing the components;

testing the components on the substrate to generate test data indicative of a location of good components that meet a predetermined criteria and of defective components that do not meet the predetermined criteria; and forming the contacts on the good components on the substrate but not on the defective components on the substrate using the test data;

wherein the components comprise semiconductor packages, the substrate comprises a panel and the testing step is performed using spring loaded electrical connectors.

6. The method of claim 5 further comprising providing the components with component contacts comprising non-oxidizing layers configured for electrical contact with the spring loaded electrical connectors.

7. A method for fabricating contacts on semiconductor components having component contacts comprising:

providing a substrate containing the components;

probe testing the components on the substrate using probe contacts and test circuitry in electrical communication with the probe contacts to ascertain selected characteristics and locations of selected components on the substrate;

compiling and storing the data from the probe testing step indicative of the selected characteristics and locations of the selected components; and bumping the component contacts on the selected components using the test data.

8. The method of claim 7 wherein the bumping step is performed using a ball bumper apparatus programmed with the test data, and configured to attach solder bumps to the component contacts on the selected components.

9. The method of claim 7 wherein the bumping step is performed using a stencil mask patterned using a laser scanner programmed with the test data, and configured to deposit a conductive material onto the component contacts on the selected components.

10. The method of claim 7 wherein the bumping step is performed using a ball alignment tool comprising a polymer layer patterned with openings using a laser scanner programmed with the test data, and configured to align balls to the component contacts on the selected components for reflow bonding.

11. The method of claim 7 wherein the components comprise semiconductor dice contained on a semiconductor wafer.

12. The method of claim 7 wherein the probe contacts are contained on a wafer prober.

13. A method for fabricating contacts on semiconductor components having component contacts comprising:

providing a substrate containing the components;

testing the components on the substrate to generate test data indicative of a location of good components that meet a predetermined criteria;

providing a ball bumper apparatus comprising a capillary tool and a laser configured to bond balls to the component contacts on the good components using the test data; and bonding the balls to the component contacts on the good components using the test data and the all bumper apparatus.

14. The method of claim 13 wherein the components comprise semiconductor dice, and the substrate comprises a semiconductor wafer or portion thereof.

15. The method of claim 13 wherein the components comprise semiconductor packages, an the substrate comprises a panel.

16. The method of claim 13 wherein the testing step evaluates various electrical characteristics of the components, and at least one component comprises a defective component.

17. The method of claim 13 wherein the testing step is performed using a probe card having probe contacts.

18. A method for fabricating contacts on semiconductor components having component contacts comprising:

providing a substrate containing the components;

testing the components on the substrate to generate test data identifying at least one good component and at least one defective component;

providing a laser scanner programmed with the test data;

forming a mask on the substrate by depositing a polymer layer on the substrate, and then patterning the polymer layer using the laser scanner with a plurality of openings aligned with the component contacts on the at least one good component; and depositing a conductive material into the openings.

19. The method of claim 18 further comprising heating the conductive material to bond the conductive material to the component contacts on the at least one good component.

20. The method of claim 18 wherein the depositing step is performed using a squeegee and solder in viscous form.

21. The method of claim 18 wherein the openings are generally conically shaped, and the contacts have a shape corresponding to the openings.

22. The method of claim 18 wherein the conductive material comprises solder having a generally conical shape.

23. A method for fabricating contacts on semiconductor components having component contacts comprising:

providing a substrate containing the components;

testing the components on the substrate to ascertain characteristics and locations of selected components on the substrate;

depositing a polymer layer on the substrate;

providing a laser scanner programmed to form openings in the polymer layer aligned with the component contacts on the selected components;

depositing a conductive material into the openings; and heating the conductive material to bond the conductive material to the component contacts on the selected components and form the contacts as bumps.

24. The method of claim, 23 wherein the openings are generally conically shape and the bumps have tapered sidewalls.

25. The method of claim 23 wherein the selected components meet a predetermined criteria.

26. The method of claim 23 wherein the components comprise semiconductor dice, the substrate comprises a semiconductor wafer and the testing step is performed using a wafer prober.

27. The method of claim 23 wherein the components comprise semiconductor dice, the component contacts comprise bond pads and the conductive material comprises solder.

28. The method of claim 23 wherein the polymer layer comprises a curable material or a tape material.

29. A method for fabricating contacts on semiconductor components having component contacts comprising:

providing a substrate containing the components;

testing the component on the substrate to generate test data identifying good components and defective components;

providing a laser scanner programmed with the test data;

patterning a polymer film using the laser scanner with a plurality of openings configured to align with the component contacts on the good components;

attaching the polymer film to a ball alignment tool comprising a base configured to retain the polymer film with the openings in flow communication with a vacuum, and to retain he substrate in alignment with the polymer film;

placing a plurality of ails in the openings, and aligning the balls to the component contacts on the good components using the tool; and bonding the balls to the component contacts on the good components.

30. The method of claim 29 wherein the bonding step comprises heating the balls.

31. The method of claim 29 wherein the base comprises an alignment member configured to align the substrate to the polymer film.

32. The method of claim 29 wherein the base comprise a vacuum chamber configured to retain the vacuum.

33. The method of claim 29 wherein the holes in the polymer film are generally conically shaped.

* * * * *

UNITED STATES PATENT AND TRADEMARK OFFICE
CERTIFICATE OF CORRECTION

PATENT NO. : 6,680,213 B2  
DATED : January 20, 2004  
INVENTOR(S) : Warren M. Farnworth, Alan G. Wood and Douglas Kelly It is certified that error appears in the above-identified patent and that said Letters Patent is hereby corrected as shown below:

Column 12,  
Line 59, change "component" to -- components --

Column 14,  
Line 44, change "all" to -- balls --.  
Line 51, change "an" to -- and --.

Column 16,  
Line 11, change "component" to -- components --.  
Line 21, change "he" to -- the --.  
Line 23, change "ails" to -- balls --.  
Line 33, change "comprise" to -- comprises --.

Signed and Sealed this

Twenty-fifth Day of May, 2004

JON W. DUDAS  
*Acting Director of the United States Patent and Trademark Office*